(12) United States Patent
Chavez et al.

(10) Patent No.: US 6,380,725 B1
(45) Date of Patent: Apr. 30, 2002

(54) VOLTAGE SENSOR

(75) Inventors: Patrick Pablo Chavez; Farnoosh Rahmatian; Nicolas August Fleming Jaeger; Christopher Paul Yakymyshyn, all of Vancouver (CA)

(73) Assignee: NxtPhase Corporation, Vancouver (CA)

( * ) Notice: Subject to any disclaimer, the term of this patent is extended or adjusted under 35 U.S.C. 154(b) by 0 days.

(21) Appl. No.: 09/503,897

(22) Filed: Feb. 15, 2000

(51) Int. Cl.$^7$ .............................................. G01R 31/00
(52) U.S. Cl. ........................ 324/96; 324/72; 250/227.14
(58) Field of Search ........................ 324/96, 750, 126, 324/127, 117 R, 753, 72; 250/227.14, 227.17, 227.18, 227.19

(56) References Cited

U.S. PATENT DOCUMENTS

| | | |
|---|---|---|
| 3,938,039 A | 2/1976 | Hermstein et al. |
| 4,929,830 A | 5/1990 | Bohnert et al. |
| 4,939,447 A | 7/1990 | Bohnert et al. |
| 5,029,273 A | 7/1991 | Jaeger |
| 5,053,693 A | 10/1991 | Bohnert et al. |
| 5,053,694 A | 10/1991 | Bohnert et al. |
| 5,267,336 A | 11/1993 | Sriram et al. |
| 5,272,460 A | 12/1993 | Baumgartner et al. |
| 5,475,773 A | 12/1995 | Ingold |
| 5,477,134 A | 12/1995 | Hamada |
| 5,731,579 A | 3/1998 | Woods |
| 5,892,357 A | 4/1999 | Woods |
| 5,917,316 A | 6/1999 | Bosco et al. |
| 6,127,817 A | * 10/2000 | Chartrefou .................... 324/96 |

FOREIGN PATENT DOCUMENTS

| | | |
|---|---|---|
| JP | 02150774 | 6/1990 |
| JP | 5273256 | 10/1993 |
| WO | 94/25937 | 11/1994 |
| WO | 00/34793 | 6/2000 |

OTHER PUBLICATIONS

Jaeger & Rahmatian "Integrated Optics Pockets Cell High–Voltage Sensor" IEEE Trans. on Power Delivery vol. 10 No. 1 pp. 127–134 Jan. 95.
Jaeger & Huang "Push–Pull Integrated–Optics Mach–Zehnder Interferometer with Domain Inversion in One Branch" Optics Letters vol. 20 No. 3 pp 288–290 Feb. 1995.
Weikel & Stranovsky "Application of an Electro–Optic Voltage Transducer at 345 kV" Presented at EPR I Optical Sensors for Utility T&D App. Workshop Jul. 20–21, 1995.
PCT search report of the corresponding PCT application No. PCT/CA01/00103 Nov. 6, 2001.
Mathis M et al "Optishe Sensoren Fuer Hochspannungsschaltanlagen" Elektrotechnische Zeitschrift—ETZ, DE, VDE Verlag GMBH Berlin vol. 117 No. 8 Sep. 1, 1996.

* cited by examiner

*Primary Examiner*—Safet Metjahic
*Assistant Examiner*—Vincent Q. Nguyen
(74) *Attorney, Agent, or Firm*—C. A. Rowley (57) ABSTRACT

A voltage sensor for measuring the voltage on high voltage lines is formed by an electrically isolating-section of material with resistive shielding (RS) that structures the electric field generated by a voltage difference between the two ends of the isolating-section and provides shielding of the internal electric field from sources of electric field interference external to the voltage sensor. At least one electric field sensor is provided to sense the electric field in the isolating-section the output(s) of which is(are) used to infer the voltage difference.

37 Claims, 6 Drawing Sheets

VOLTAGE SENSOR

FIELD OF THE INVENTION

The present invention relates to a voltage sensor for measuring voltage and is particularly suitable for measuring high voltages such as on high-voltage power transmission lines.

BACKGROUND TO THE INVENTION

The list of known high-voltage voltage sensors includes inductive transformers, capacitive dividers or capacitive voltage transformers, and transducers using bulk-optic electric field sensors. The first two sensors suffer from bandwidth restrictions, expensive failure, extensive maintenance, heavy weight, and output variations. They also suffer from the need for substantial insulation that is both expensive and potentially hazardous to the environment (e.g oil and/or $SF_6$ gas).

Pockels cells are known devices that have been used for measuring voltage particularly high voltage, for example see U.S. Pat. No. 5,477,134 issued to H. Hamada and U.S. Pat. No. 5,731,579 issued to G. K. Woods. A preferred form of Pockels cell for use in the present invention is an integrated optics Pockels cell such as that described in U.S. Pat. No. 5,029,273 issued Jul. 2, 1991 to Jaeger the disclosure of which is incorporated herein by reference.

U.S. Pat. No. 5,917,316 "Measuring device for a metal-enclosed, gas-insulated high-voltage installation," issued Jun. 29, 1999, to A. Bosco, T. Hertig, and A. Kaczkowski, describes a high-voltage voltage sensor that uses a metallic enclosure providing shielding of a voltage detector located inside the enclosure against external voltage sources in order to obtain high measurement accuracy. The enclosure contains a high-voltage conductor and is filled with pressurized $SF_6$ gas in order to sustain high-electric field stresses.

An earlier application namely U.S. Pat. No. application Ser. No. 09/204,507 filed Dec. 4, 1998 by Jaeger et al. now U.S. Pat. No. 6,289,603, the disclosure of which is incorporated herein by reference, discloses a voltage sensor similar to the present invention, but one wherein the Admittance Shielding (AS) is based primarily on dielectric shielding. This shielding while effective requires the use of materials with high permittivities which are not always easy to obtain and generally are expensive and relatively heavy.

Other systems using essentially similar voltage transducers (VTs) to those used with the present invention i.e. those that use at least one electric field sensor (EFS) to give a measurement of voltage, use admittance shielding (AS) as described in detail herein below to improve the effectiveness of the system. These known admittance shielding systems are conceived by manipulating metallic conductor (electrode) geometries (or as above indicated selecting materials with relatively large permittivities (as taught in the said Jaeger et al. application)) to attain a good level of admittance shielding.

For example one method of obtaining AS is to in effect decrease the distance between the two conductors between which voltage is to be measured. Another is to surround one conductor with the other conductor as much as possible. Both of these methods have the effect of increasing the admittance between the two conductors where the EFSs are located. Use of these methods results in the existence of high electric field stresses that must be supported with special insulation such as $SF_6$ gas. Examples of this can be found in U.S. Pat. No. 3,938,039 "Voltage measuring device for encapsulated high-voltage installations," issued Feb. 10, 1976, to W. Hermstein, G. Rosenberger, and W. Muller; U.S. Pat. No. 5,272,460 "Current and voltage transformer for a metal-encapsulated, gas-insulated high-voltage installation," issued Dec. 21, 1993, to R. Baumgartner, K. Y. Haffler, H. Hageli, and A. Kaczkowski; U.S. Pat. No. 5,892,357 "Electro-optic voltage sensor for sensing voltage in an E-field," issued Apr. 6, 1999, to G. K. Woods and T. W. Renak; and Japan Patent 05273256"Insulator built-in type photo voltage sensor," issued Oct. 22, 1993, to O. Tetsuo.

The use of resistive materials in high-voltage applications is known (e.g. in a resistive divider used for dividing voltage, or at cable terminations for grading the field at the end of high voltage cables) but not for use in shielding (of EFSs) in order to measure voltage.

BRIEF DESCRIPTION OF THE PRESENT INVENTION

The present invention reduces significantly the deficiencies inherent to the existing high-voltage sensor technology.

The simple structure of the invention substantially removes the need for usually expensive and/or environmentally unfriendly insulation; may be made lighter, allowing for less expensive transportation, installation, and maintenance; and is compatible with existing standoff structures, allowing for easy construction.

When used with compact electric field sensor technology, such as the integrated optics Pockels cell, the invention offers wide bandwidth and easy interfacing with emerging digital technology.

Broadly the present invention relates to an apparatus for measuring voltage comprising an electrically isolating-section, a pair of spaced conductors between which voltage difference V is to be determined, one of said conductors being at one end of said isolating-section and another at an end of said isolating-section remote from said one end, at least one electric field sensor which senses electric field at at least one location within said isolating-section, a detector for determining a value $V_d$ for said voltage difference V based on said electric field(s) sensed by said at least one electric field sensor, said isolating-section formed of a primarily resistive material having a resistance in the range of 25 GΩ to 50 kΩ so as to provide sufficient shielding of said at least one location from sources of electric field interference of practical strength external to said apparatus so that said sources of practical strength do not change said sensed electric field sensed at said at least one location to generate a significant error in said value $V_d$ for said voltage difference V.

Broadly the present invention also relates to an apparatus for measuring voltage comprising an electrically isolating-section, a pair of spaced conductors between which voltage difference V is to be determined, one of said conductors being at one end of said isolating-section and another at an end of said isolating-section remote from said one end, at least one electric field sensor which senses electric field at at least one location within said isolating-section, a detector for determining a value $V_d$ for said voltage difference V based on said electric field sensed by said at least one electric field sensor, said isolating-section formed of a primarily resistive material having a resistance per unit of length in the range of 25 GΩ/m to 50 kΩ/m so as to provide sufficient shielding of said at least one location from sources of electric field disturbance of practical strength external to said apparatus so that said sources of practical strength do not change said sensed electric field sensed at said at least one location to generate a significant error in said value $V_d$ for said voltage difference V.

Preferably said resistance per unit of length is in the range of 1 GΩm to 500 kΩ/m.

Preferably said sufficient shielding reduces the error in said determined voltage $V_d$ to less than 25% of an error in $V_d$ that would be attained if said isolating-section was not provided.

Preferably said sufficient shielding reduces the error in said determined voltage $V_d$ to less than 1%.

Preferably said sufficient shielding reduces the error in said determined voltage $V_d$ to less than 0.3%.

Preferably said isolating-section is a hollow section in which the electric field sensor is mounted.

Preferably the material of the isolating-section is polyethylene doped with carbon black.

Preferably the isolating-section is enclosed in a protective sleeve protecting said isolating-section from the environment.

Preferably the electric field sensor is an optical electric field sensor.

BRIEF DESCRIPTION OF THE DRAWINGS

Further features, objects and advantages will be evident from the following detailed description taken in conjunction with the accompanying drawings in which.

DESCRIPTION OF THE PREFERRED EMBODIMENTS

The present invention is based on Applicant's finding that not only may resistive shielding (RS) be used in High Voltage measurements to shield sensors from external sources of interference, but it may be made to be practically as effective at shielding as prior art shielding and to further include improved properties. Resistive shielding (RS) relies on resistive materials with conductivities that can be much more readily obtainable than the high permittivities of the materials required for capacitive or dielectric shielding. Resistive materials are abundant and come in many varieties, the potential exists when practicing the present invention to use very thin malleable materials, possibly even a properly designed semi-conductive paint covering the properly shaped and dimensioned housing for the sensor (isolating-section 2 as will be described below), that offer much better shielding and significantly reduced size and weight than dielectric shielding as described in the Jaeger et al. application identified above and that do not rely on metal electrode manipulation.

The RS system of the present invention relies on selecting resistive materials to form the isolating-section 2 of the invention. The materials selected will possess relatively small conductivities, i.e. the isolating-section 2 will possess a resistance per unit of length (measured in the direction between the terminals or electrodes 8 and 10 at the opposite ends of the section 2, in the illustrated arrangement axially of the tube 2) in Ohms(Ω)/meter(m) in the range of 25 GΩ/m to 50 kΩ/m, more preferably 1 GΩ/m to 500 kΩ/m. The rule is $R=L*\rho/A$ where R is the resistance, $\rho$ is a uniform "resistivity", A is the cross-sectional area, and L is the length (equivalently, $G=A*\sigma/L$ where G is the conductance, $\sigma$ is a uniform "conductivity", A is the cross-sectional area, and L is the length. $G=1/R$ and $\sigma=1/\rho$). Thus defining the resistance per unit length of the isolating-section 2, defines the product $\rho/A$ for a voltage transducer with an isolating-section of a length L. This rule is true if the conductivity is uniform and the vertical electric field component is uniform. If the conductivity is not uniform and/or the vertical electric field component is not uniform, the relationship among R, A, $\rho$, and L is mathematically more complex but with still the same meaning and that is that the resistance R decreases as the cross-sectional area A increases, increases as the resistivity $\rho$ increases, and increases as the length L increases. Generally for most HV applications the isolating-section 2 will possess a resistance in the range of 25 GΩ to 50 kΩ.

The systems of the present invention provide voltage measurements i.e. determine values $V_d$ for the voltage V being determined so that errors in $V_d$ relative to the actual voltage V due to the influences of external sources are small, preferably less than 6%, preferably less than 1%, more preferably less than 0.3% and most preferably less than 0.1%.

Figure 1:
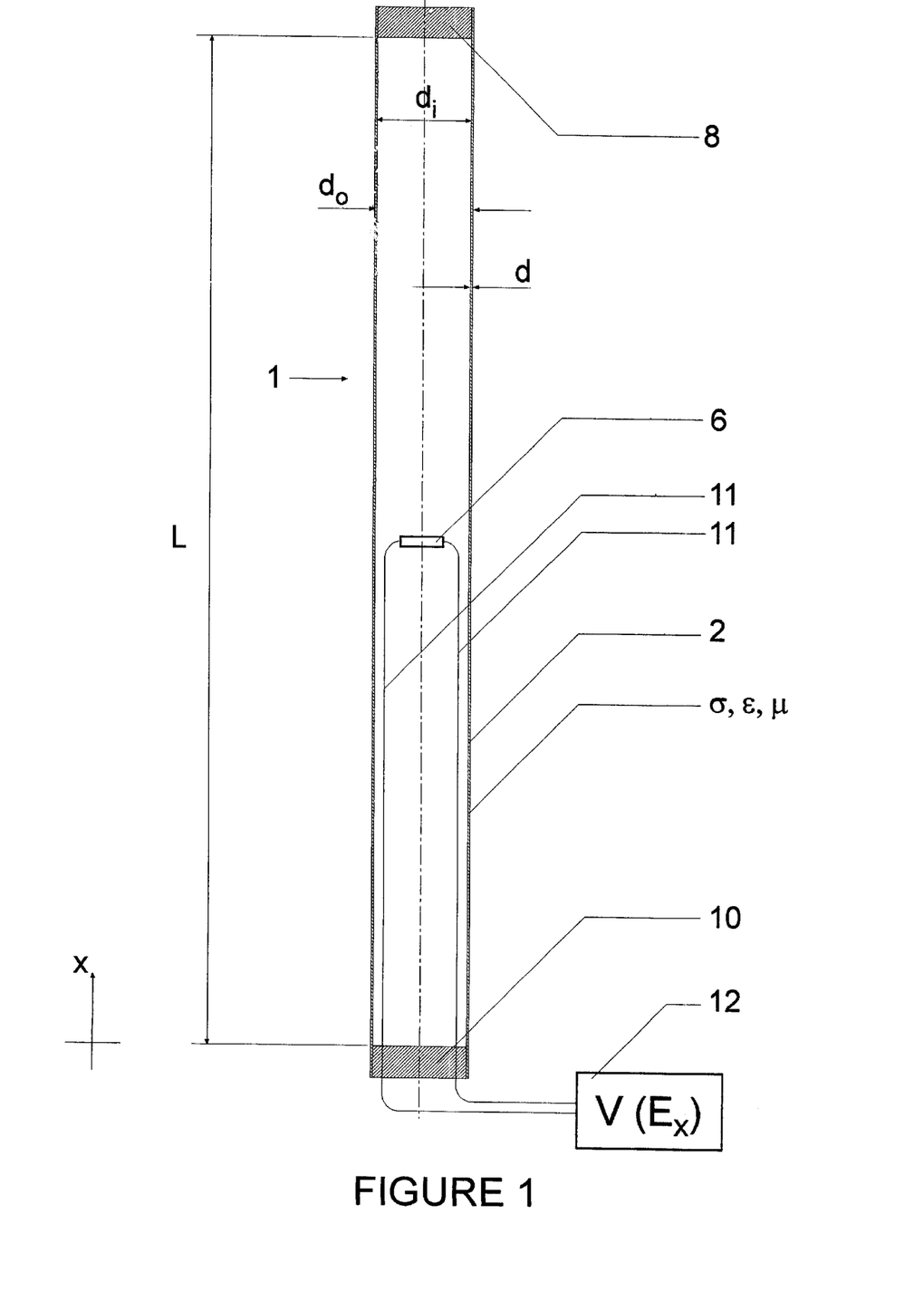
FIG. 1 illustrates the basic structure of the invention.

The basic elements of the invention 1 as schematically shown in FIG. 1 include an inner tube or isolating-section 2 having a "top" electrode 8 and "bottom" electrode 10 one at each of its axial ends. It will be recognized that the isolating-section 2 need not be positioned with its longitudinal axis vertical. At least one electric field sensor (EFS) 6 (only one is necessary, but more may be used if desired) is mounted at a selected location(s) in the isolating-section 2 (see said Jaeger et al. application referred to above and incorporated herein by reference). The EFS(s) is (are) connected to a detecting unit 12 through optical fiber(s) 11. The EFS measurement(s) is(are) used to determine the value $V_d$ for the voltage difference V between electrode 8 and electrode 10.

When more than one EFS is used, the output of each EFS may be separately measured and subsequently combined with other EFS measurements to determine voltage difference $V_d$, or all EFSs can be put in series, each possibly selected to have a different sensitivity, so that the combination of electric field measurements happens physically by way of light going through the sensors in series to determine said voltage difference, or any combination of separate and series EFSs described above can be used to determine said voltage difference (see said Jaeger at al. application referred to above).

Figure 2:
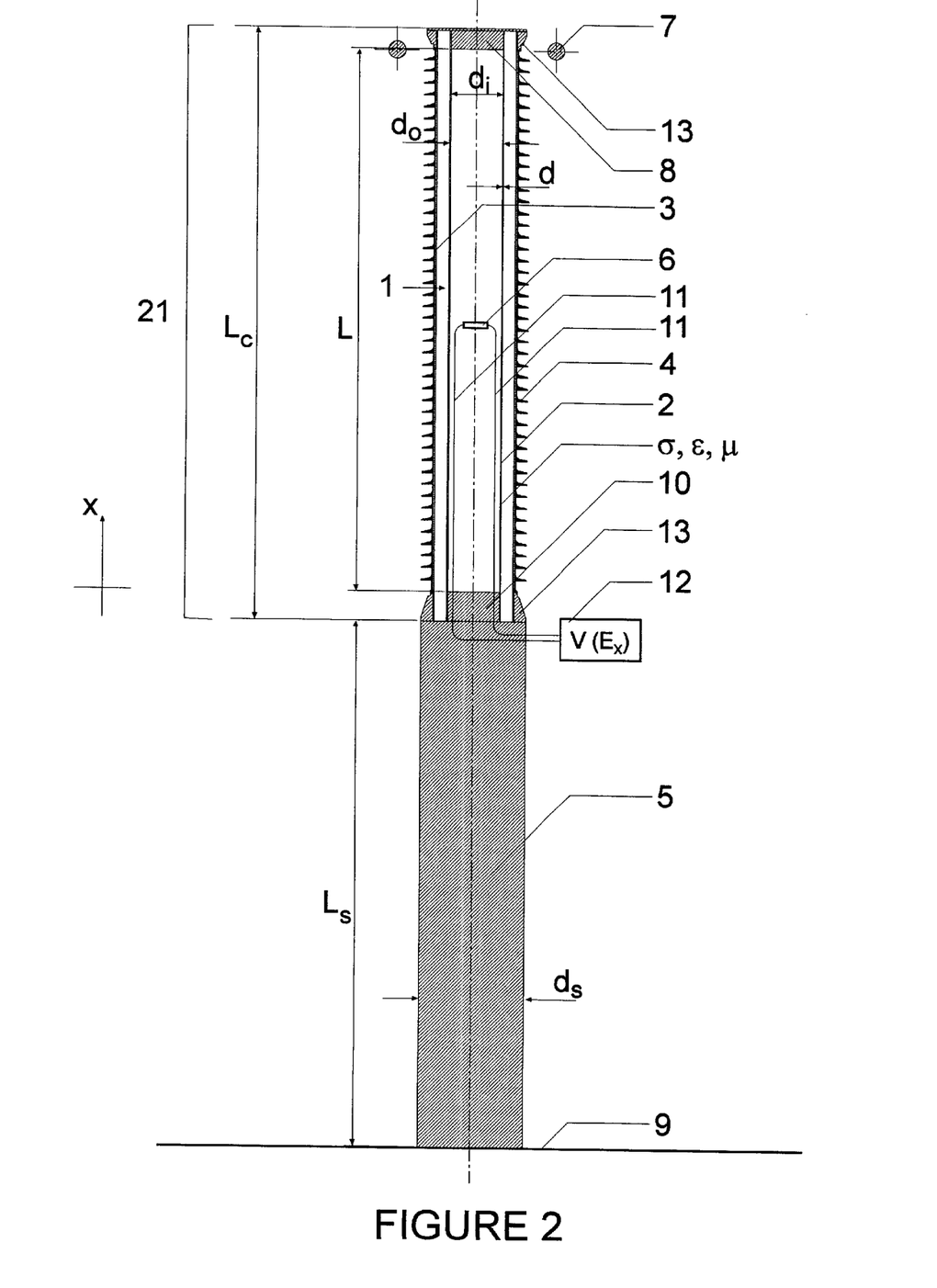
FIG. 2 illustrates an Electric Field Sensor Voltage Transducer (EFSVT) structure of the present invention as it may be installed in a high-voltage substation.

The invention 1 applied to a standoff 21 for measuring line-to-ground voltage is schematically shown in FIG. 2. The standoff 21 is formed by the above described basic elements of the invention 1 including the inner tube 2 which is surrounded by an external protective sleeve (tube) 3 having sheds 4 and flanges 13 at axial ends for interfacing with conductive (typically metallic) elements such as stand 5, which happens to also support the standoff 21. The external tube 3 and sheds 4 are provided to protect the invention 1 from the outside environment while providing insulation and mechanical support between two ends of the invention. In this example, FIG. 2, the metallic stand 5 is connected to ground schematically indicated at 9 and the top electrode 8 to a HV line. A corona ring 7 is suspended near its top electrode 8 where a high voltage is applied so as to moderate the high electric fields that would otherwise be present at the top electrode 8 which may cause flashover. At very high voltages, typically, the top electrode 8 would be electrically connected to a HV line, and the invention 1 would be used to measure the line-to-ground voltage.

The isolating-section 2 may, if desired, be made integral with the protecting tube 3 rather than as a separate entity spaced from the tube 3. It is envisioned that a properly selected semi-conductive paint covering a surface of the tube 3 may be used to define the isolating-section 2.

Generally, the invention 1 may be positioned between and connected to any two conductors between which the voltage is to be measured, e.g., the voltage between two phases in a three-phase system.

Figure 4:
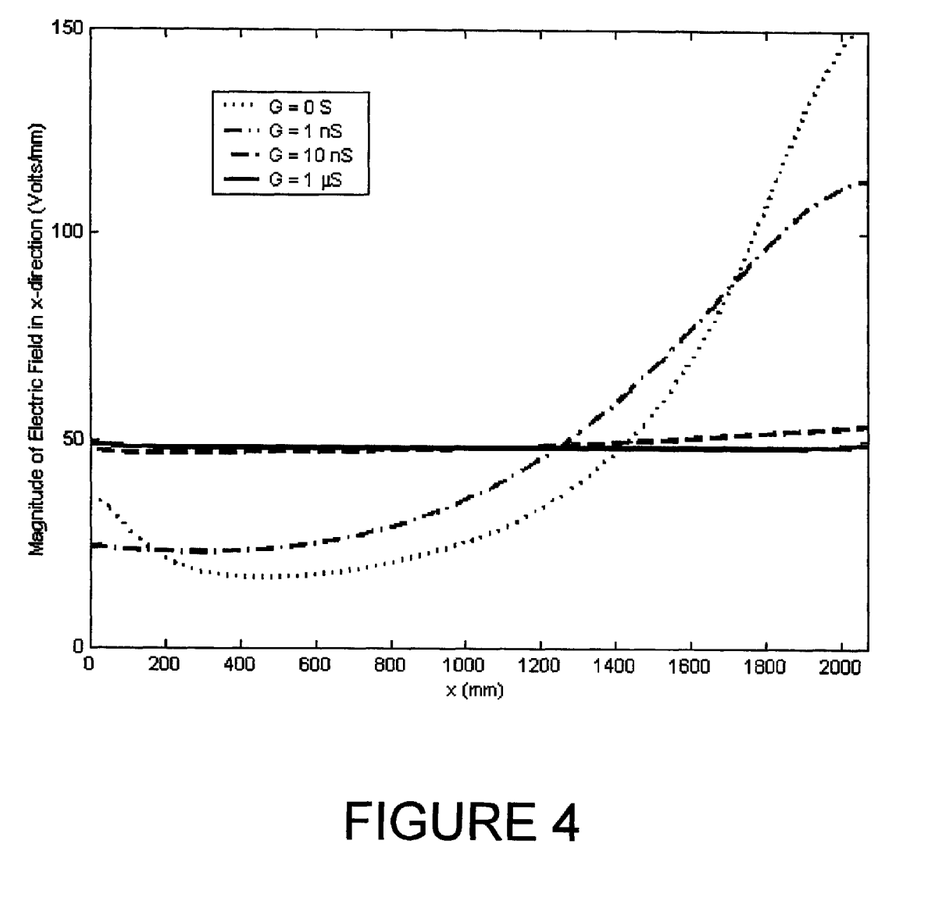
FIG. 4 shows plots of the magnitude of the x-component of the electric field distribution of an example for the case of the standoff structure with an applied voltage of 100 kV and varying conductances.
Figure 4A:
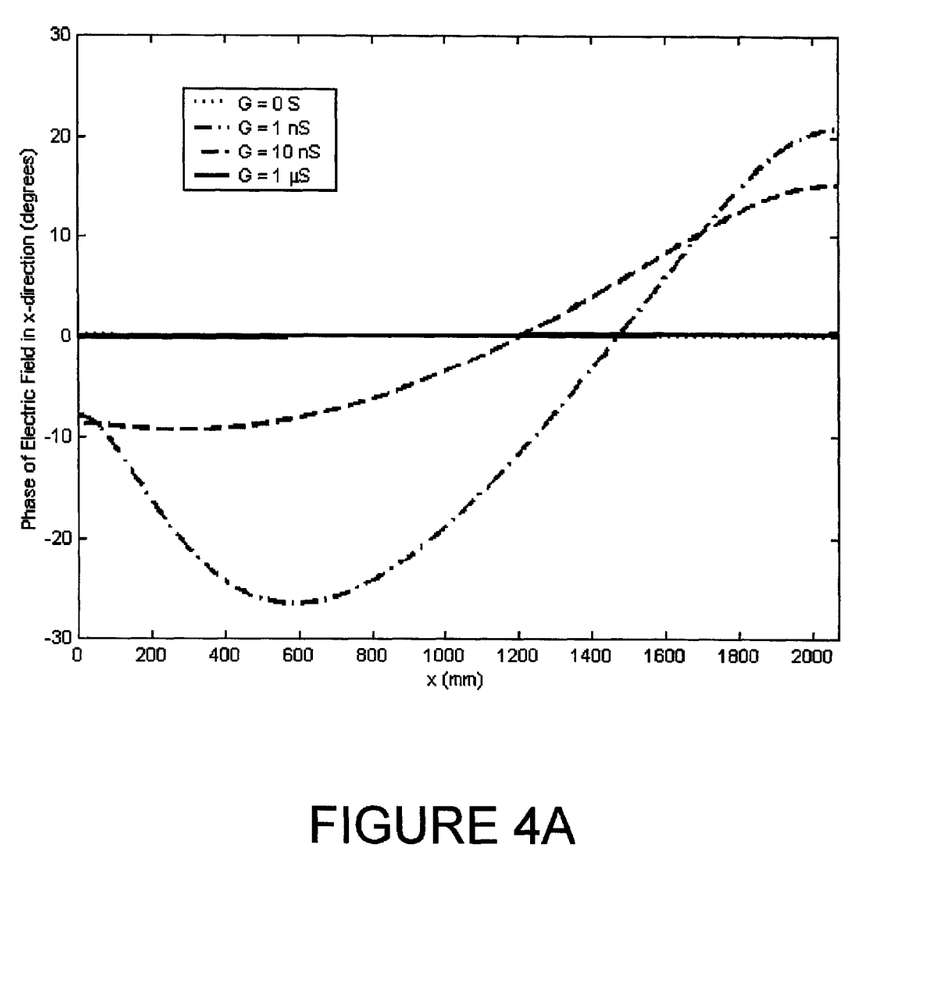
FIG. 4A shows plots of the phase of the x-component of the electric field distribution of an example for the case of the standoff structure with an applied voltage of 100 kV and varying conductances.
Figure 5:
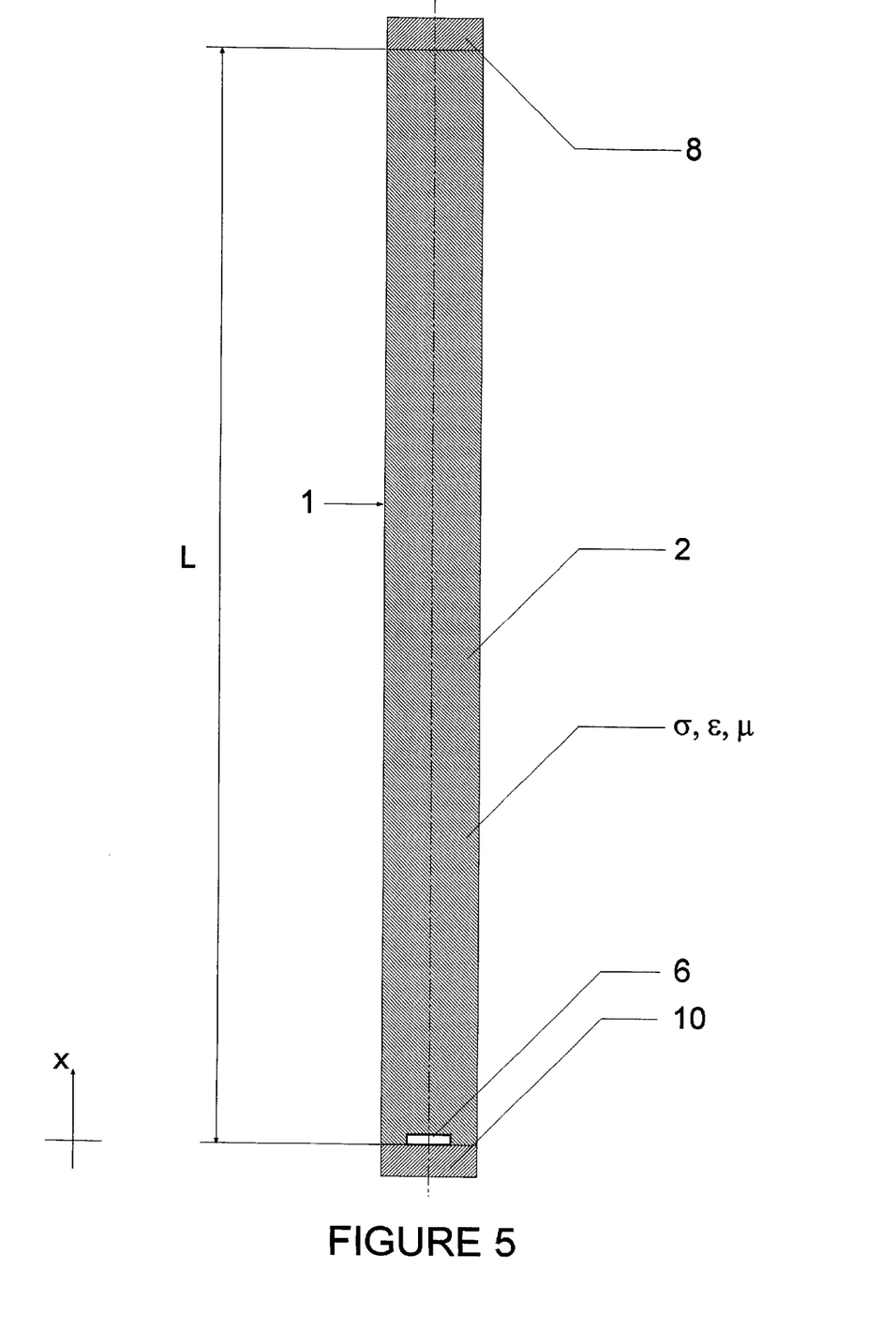
FIG. 5 is a view similar to FIG. 1 of a modified version of the invention showing the use of a solid rod (as opposed to a hollow column) to form the isolating-section.

In the embodiment shown in FIG. 1 the isolating-section 2 has been shown as a hollow tubular section with an outside diameter $d_o$, an inside diameter $d_i$, a thickness $d(d_o-d_i=2d)$ and a length L. Obviously if the tube 2 is solid (not hollow), as it may be, if desired, $d_i$ is zero (0). The cross-sectional area A of the isolating-section 2 obviously is a function of $d_i$ and $d_o$. The area A, the length L, the conductivity σ, the permittivity ϵ, and the permeability μ of the isolating-section 2 define the admittance shielding AS and, as discussed below with respect to FIGS. 4 and 4A, are in accordance with the present invention coordinated in a specific manner and so that the conductivity of the material from which the isolating-section 2 is made and the cross-sectional area A of the isolating-section 2 are of selected values to influence the structure of the electric field to conform with that required for effective operation of the invention 1.

The choice of L for a given material from which the isolating-section 2 is made depends on many factors. One important factor is safety. The length L should be sufficiently long to ensure safety. The value L will be chosen so that the electric field anywhere in and around the isolating-section 2 is not greater than the break-down strength (field) of the material(s) present under any reasonable operating condition as provided by governing bodies such as the Institute of Electrical and Electronics Engineers (IEEE), the American National Standards Institute (ANSI), the International Electro-technical Commission (IEC), and/or other local and international standards. Typically, the minimum length L of the isolating-section is limited by the maximum acceptable electric field intensity (closer electrodes, higher intensities), and the maximum length L of the isolating-section is limited by the desired size and weight of the invention, which is preferably as small as possible.

The choice of cross-sectional area A (e.g. thickness d) for a given material is also limited by many factors. Two important practical limitations are size and weight. The cross-sectional area A will be chosen so that size and weight will be small enough for installation requirements and mechanical stability.

The isolating-section 2 need not be tubular or uniform. It can have various different shapes, uniform or non-uniform. For example it can have rectangular cross-section, be hollow or solid, have varying materials (having different resistivities) in various locations in the isolating-section. The choice of the shape and the material depends very much on the application and the principles as taught in this patent application can be used to determine suitable designs for an isolating-section to be used in a particular application. For example, simulations have shown that an axially symmetric tube having circumferentially nonuniform shielding (varying resistivities) works and it is believed that asymmetric axial nonuniformity would work as well; it is believed, what is important are the actual resistance of the isolating-section and proximity of the shielding to the sensors relative to the proximity of the interference source to the sensors.

When a voltage V is applied across a conductance G, heat is generated at a rate $V^2*G$. The physical object having the conductance G (in our case the isolating-section 2) must dissipate this heat. Typically, the heat is dissipated to the ambient environment through mechanisms such as heat conduction, convection, and radiation which depend on the physical properties and conditions of the object, e.g., shape, material, and temperature, and of the ambient environment, e.g., material and temperature. If the heat generated cannot be dissipated, the object will overheat and eventually be destroyed. In the case of the isolating-section, its shape, cross-sectional area A, length L, and material properties must be designed in such a way that this overheating does not occur taking into account the environment in which it is to function, e.g., temperature range.

Also, the heat generated and then dissipated in the object is related to an amount of power $P=V^2/R$. In the case of the isolating-section, this power P is taken from the conductors being measured for voltage difference. Naturally, in order not to waste energy, this amount must be kept sufficiently small for the invention to be acceptable, so the maximum conductivity must also be sufficiently small. For example, for a transmission line at 130 kV line-to-ground (approximately 230 kV line-to-line) with a current of 3,000 amperes, the total power transmitted down the line is approximately $P_t=130,000\times3,000$ watts (W)=390 MW. For measuring the voltage on this line using the present invention having an isolating-section with R=10 MΩ(G =0.1 μS), the power P dissipated is $P=(130,000)^2/10^7$ W=1.69 kW. So, the fraction of power lost is $P/P_t<0.0005\%$.

Admittance of say, a solid rod of material is directly related to the conductivity and permittivity of the material and the cross-sectional area of the rod (related to "$d_o$" and "$d_i$") and inversely related to the length of the rod (related to "L"). It is therefore possible to obtain a particular admittance by varying the geometry of the rod, which is what is equivalently done in certain prior art for which the equivalent rod is made of air and the electrode geometries at the ends of the rod are varied, e.g. they are brought very close together and the rod is made very short until the admittance between electrodes is high enough to provide sufficient shielding. Alternatively, as taught in the Jaeger et al. application referred to above the permittivity can be increased. In fact, both permittivity and conductivity can be increased together to improve shielding.

In the present invention an increase in the conductance is used, which permits a trade-off between varying geometry and varying material conductivity. Thus in the resistance shielding of the present invention the electrodes need not be brought close together (requiring the use of special insulation) nor does the cross-sectional area of isolating-section 2 have to be increased (resulting in larger size and weight), but instead the present invention takes advantage of the flexibility in changing the material properties of the isolating-section 2, specifically, its conductivity.

When a voltage difference is applied between the top 8 and the bottom 10 of the isolating-section 2, e.g. when 8 is electrically connected to high voltage and 10 is connected to ground, the material from which 2 is constructed causes a structured electric field distribution in and around 2. As the conductance G of the isolating-section 2 of the invention 1 is increased, which can be accomplished by using a material having higher conductivity σ, the structures of the magnitude and phase distributions of the x-component (axial component relative to the longitudinal axis of the tube 2) of the electric field change, i.e., the magnitude distribution changes to be more uniform as confirmed in the results plotted in FIGS. 4 and 4A (compare G=0 Siemens (S) with G=10 nS).

An example of a potentially useful resistive material forming the isolating-section is polyethylene doped with carbon black. Different conductivities can be attained by varying the doping levels of carbon black. For example, a thin film (approximately 0.1 mm thick) can be made of polyethylene containing carbon black uniformly distributed therethrough at levels ranging between 40 phr to 50 phr (parts per hundred) and could be positioned along the inside of the protective sleeve (protective tube) 3 for good resistive shielding in a 230 kV class electric field sensor voltage transducer (EFSVT).

Though the system is operative with conductance G=0 and would still determine a voltage based on the EFS measurement(s), the voltage determined could be inaccurate if the electric field distribution is significantly altered, see said Jaeger et al application, and/or EFS measurement(s) changes (change) in the presence of external sources of electric field interference (insufficient shielding). The overall accuracy of the system improves if the magnitude of admittance is greater, i.e., the field distribution is less affected by external influences. Typical external influences include the presence of other conductors at various potentials and the effects of pollution on and around said external tube 3 and its sheds 4 and other nearby structures, conducting or non-conducting, mobile or stationary. Typically, the effects of many of these influences are not that severe since other structures are usually located at distances that are large enough for safety reasons and are determined using various relevant IEEE, ANSI, IEC, and/or other standards or guidelines for each voltage class.

The present invention is a significant advancement over prior art in that the overall accuracy of the system is achieved, i.e., sufficient admittance shielding is accomplished, by increasing the conductivity σ of the material forming the isolating-section 2 which increases the conductance G of the isolating-section 2. Most importantly, L can be selected to be large enough to prevent high electric field intensities due to conductors in close proximity and, therefore, eliminate the need for special insulation resulting in a simpler, safer voltage transducer. For example, for a 230 kV EFSVT the conductance G of the isolating-section 2 can be 10 nS (1×10⁻⁸ S) for an isolating-section 2 which is 2.07 meters long (measured parallel to the longitudinal axis of the isolating-section 2).

A finite number of electric field sensors (EFSs) will be positioned in the isolating-section 2, the total number of EFSs positioned in the isolating-section 2 may, for example, be set as high as 200, but typically will not exceed 9 and normally will be less than 6. The number of EFSs may be chosen as described in the above referred to Jaeger et al. patent application which has been incorporated herein by reference.

The preferred forms of EFSs are small optical EFSs such as Integrated Optics Electric Field Sensors (IOEFSs) more specifically Integrated Optics Pockels Cell (IOPC) EFSs as described in the above referred to Jaeger patent and small bulk-optics Pockels cells. Other suitable EFSs may be used. For example, Mach-Zehnder type field sensors such as those with domain inversion in one branch may be used (see for example N.A.F. Jaeger and L. Huang "Push-Pull Integrated-optics Mach-Zehnder Interferometer with Domain Inversion in One Branch" Optics Letters, vol. 20, no. 3, pp. 288–290, February 1995, or a sensor as described in U.S. Pat. No. 5,267,336 issued Nov. 30, 1993 to Sriram et al.).

Other EFS examples can be found in U.S. Pat. No. 4,929,830 "Fiber-optic electric field sensor with piezoelectric body sensor," issued May 29, 1990 to K. Bohnert, M. Kaufinn, and J. Nehring; U.S. Pat. No. 5,053,694 "Device for measuring an electric field" issued Oct. 1, 1991, to K. Bohnert and J. Nehring; U.S. Pat. No. 5,053,693 "Fibreoptical sensor" issued Oct. 1, 1991, to K. Bohnert and W. Buser; U.S. Pat. No. 5,475,773 "Fiber-optic quartz voltage sensor" issued Dec. 12, 1995, to M. Ingold; and U.S. Pat. No. 5,731,579 "Electro-optical voltage sensor head" issued Mar. 24, 1998, to G. K. Woods. Another EFS example can be found in "Application of an Electro Optic Voltage Transducer at 345 kV" presented by S. Weikel and G. Stranovsky at the EPRI Optical Sensors for Utility T&D Applications Workshop, Portland, Oreg., Jul. 20–21, 1995.

Also, "materially" as used in the this application, or other words such as "significantly" or "sufficiently," is defined using appropriate IEEE, ANSI, IEC, and/or other standards or guidelines available for specific applications. For example, for revenue metering in North America, VTs are typically required to have an error less than ±0.3%, i.e., the statement "do not change . . . to generate a significant error in said voltage difference determined $V_d$" means that "the voltage difference determined ($V_d$) is within ±0.3% of the actual voltage difference (V)." Obviously, for other applications, or other standards, the terms "materially" or "sufficiently" or "significantly" correspond to other numerical values.

Another example is a VT that has to meet the class 3P relaying standard according to IEC standard 60044-2 (1997–02); basically, the VT is allowed to have ±3% error in $V_d$ in measuring the voltage magnitude and ±2° phase angle error in measuring the phase of the power frequency voltage, typically a 60 Hz or 50 Hz signal, (of course there are many other requirements in the standard that are out of the scope of this brief example); so, in this case, the statement "do not change . . . to generate a significant error in said voltage difference determined $V_d$" means "the magnitude of the voltage difference determined ($V_d$) is within ±3% of the actual magnitude of V and the phase angle of the voltage difference determined ($V_d$) is within ±2° of the actual phase angle;" in other words, it means that "the VT meets all class 3P accuracy requirements according to IEC standard 60044-2 (1997–02)." In general, "material" change or error refers to a change or error that is not acceptable to the user of the equipment as far as the relevant application(s) or case(s) or requirement(s) is concerned. In other words, "sufficient accuracy" means "sufficiently small error" so that the requirements of the user on the accuracy of the device are met. Other terms used in this patent such as "sufficient screening" are to be interpreted likewise. In the high-voltage or power industry, these accuracy requirements are often recommended or set by technical authorities such as those mentioned above.

As above indicated, shielding will be applied so that the isolating-section 2 will reduce the error in $V_d$ to be preferably less than 25% of the error in $V_d$ that would be obtained if no shielding were provided. In absolute terms the shielding will be provided to reduce the error preferably to less than 6%, more preferably to less than 1%, and more preferably to less than 0.3% as above described.

The considerations for using this type of transducer will now be described.

Design Concepts for EFSVTs

The output of an EFS is a measure of the intensity of a particular component of the electric field inside the EFS; see for example N.A.F. Jaeger and F. Rahmatian, "Integrated Optics Pockels Cell High-Voltage Sensor," IEEE Trans. on Power Delivery, vol. 10, no. 1, pp. 127–134, January 1995. It is desired to use this sensory ability to measure the voltage between the top 8 and bottom 10 electrodes of the present invention; for example, line-to-ground voltage on a power line connected to the top electrode 8 when the stand 5 and bottom electrode 10 are grounded.

More explicitly, since the electric fields induced by charged electrodes are directly related to the potentials on the electrodes, it is plausible to use one or more electric field sensors at one or more points in space within the isolating-section 2 to infer the voltage difference between both ends (see the Jaeger et al. application referred to above).

Admittance Shielding (AS)

Using the invention with the intention of measuring a voltage between two points on a HV transmission system, a suitable EFS could be used by being appropriately placed somewhere in a standoff structure 21 attached to the transmission line. The standoff 21 is formed by the basic elements of the invention 1 including the inner tube 2 which is surrounded by an external protecting tube 3 having sheds 4 and flanges 13 at axial ends for interfacing with conductive (typically metallic) elements such as stand 5, which happens to also support the invention 1 in this case. The EFS(s) output(s) is(are) used to deduce the voltage on the transmission line. Since the EFS output depends on the electric field the standoff structure 21 must be modified in such a way so as to reduce the coupling effects of other HV transmission lines and any other structures in the vicinity.

Using the invention, systems may be designed to measure any reasonable voltage. The economic (and safety) benefits, i.e. practical range of usage, will be at higher voltages in the several-thousand-volt ranges.

The quasistatic electromagnetic field that exists in any space containing at least one electrical source can be approximately represented by a network of nodes locally interconnected through passive circuit elements, including capacitances, inductances, and conductances, and at least one equivalent current or voltage source (See D. M. Pozar, Microwave Engineering, Addison-Wesley, 1990 for details). Each node represents a point in space and is connected to other nodes that represent neighboring points in space. The voltage on each node represents the electric potential at the respective point in space.

Figure 3:
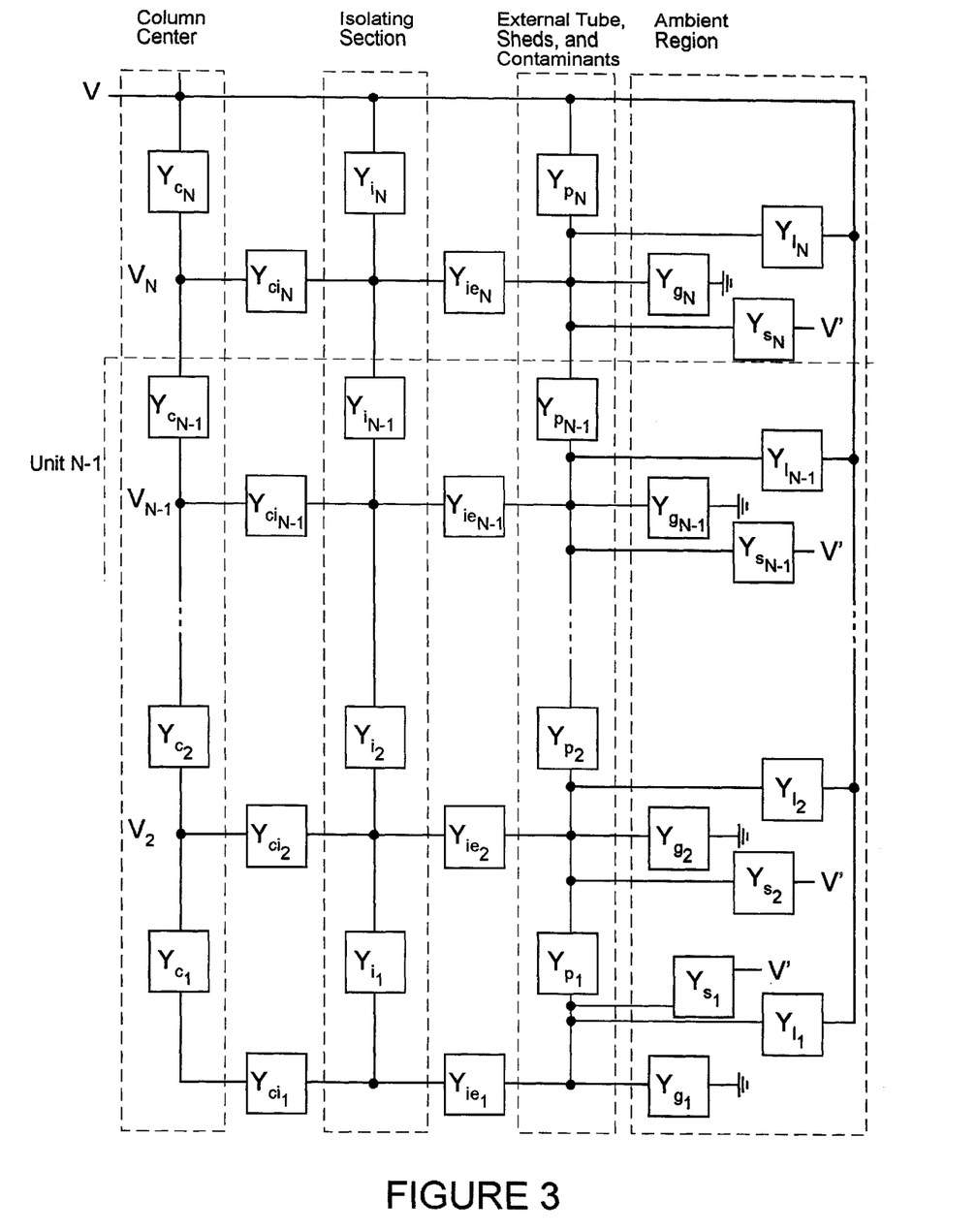
FIG. 3 shows a simplified lumped element electrical model of the invention in terms of admittances.

The model given in FIG. 3, while simplistic, is helpful in conceptually describing certain features of the admittance shielding concept. As shown in FIG. 3, the standoff 21 can be approximately modeled as a lumped linear admittance network of N stacked units. Each unit has a central self-admittance $Y_c$, a center-to-isolating-section admittance $Y_{ci}$, an isolating-section self-admittance $Y_i$, an internal-to-external coupling admittance $Y_{ie}$, an external self-admittance $Y_p$, a ground admittance $Y_g$, a line admittance $Y_l$, and an external line and source admittance $Y_s$. An EFS e.g. IOPC is physically located inside the isolating-section 2 and in effect locally measures the gradient of the electric potential distribution that exists along the center of the isolating-section 2 and that is represented by the voltages of the internal unit nodes connecting the central self-admittances $Y_c$. The self-admittance Y of the isolating-section 2 is known to be a function of the N self-admittances $Y_i$.

In FIG. 3 the standoff 21 is viewed as a composition of individual vertically stacked units. $Y_c$ represents the self-admittance of a region of space along the center of a unit, and since this region is typically occupied by air, $Y_c$ is primarily capacitive. $Y_i$ represents the self-admittance of the section of material of the isolating-section 2 in a unit. $Y_p$ represents the self-admittance of the section of external tube 3 material, shed 4 material, and possibly existing contaminant material in a unit. Depending on each of these materials, each of the associated admittances ($Y_c$, $Y_i$, $Y_p$) is a conductance, a capacitance, an inductance, or a combination of these. $Y_{ci}$ represents the coupling between the region of space along the center of a unit and the isolating-section 2 in that unit. $Y_{ie}$ represents the coupling between the isolating-section 2 in a unit and the external tube 3, sheds 4, and possibly existing contaminants in that unit. $Y_g$, $Y_l$, and $Y_s$ represent the coupling between the external tube 3, sheds 4 and possibly existing contaminants in a unit and ground, the high-voltage line being measured, and other lines or sources having an effective value of V', respectively. $Y_{ci}$, $Y_{ie}$, $Y_g$, $Y_l$, and $Y_s$ are primarily capacitances (air coupling). Also, except for very high frequencies, the inductances mentioned above are negligibly small.

For example, in order to use one EFS to measure the line voltage, a fixed one-to-one relationship between the voltage distribution at the EFS location and the line voltage must be achieved. This can be done by ensuring that the magnitudes of isolating-section self-admittances $Y_i$ are much greater than those of any other admittances that may be variable, e.g., external admittances $Y_p$, $Y_g$, and $Y_l$. In this case the current from line to ground is primarily confined to the internal branches of the units with any changes in the other admittances having negligible impact on the internal current distribution. It follows that the central voltage distribution also remains unchanged due to external admittance changes, and the one-to-one relationship between the measurement of the voltage gradient made by the EFS and the line voltage stays fixed. Changes in $Y_g$, $Y_l$, and $Y_s$ are primarily capacitive and represent changes in locations and shapes of external electrical structures e.g. transmission buses, transformers, and atmosphere while changes in $Y_p$ are primarily conductive and represent changes in the conditions of shed surfaces due to the introduction of water, ice, and other contaminants. Lowering the magnitudes of internal-to-external coupling admittances $Y_{ie}$ which are primarily capacitive improves electrical isolation of the internal field distribution from external contaminants and can be accomplished by increasing the outer diameter of the external tube 3 and/or by decreasing the outer diameter do of the inner tube 2.

In accordance with the lumped admittance model, Y can be increased in magnitude to improve isolation and reduce external coupling effects in the region. Five parameters of the isolating-section 2 can be varied to increase the magnitude of admittance Y:

(1) the length L,
(2) the cross-sectional area A,
(3) the conductivity $\sigma$,
(4) the relative permittivity $\epsilon$,
(5) the relative permeability $\mu$.

Generally for any isolating-section 2 consisting of a material of fixed electrical properties a shorter length L and/or greater cross-sectional area A of the isolating-section 2 (see FIGS. 1 and 2) gives a smaller impedance and therefore a larger Y. Also, generally for any isolating-section 2 of fixed geometry a higher conductivity σ, higher permittivity ε, and/or lower permeability μ of the isolating-section 2 gives a larger Y. In practice, varying σ as taught by the present invention allows great flexibility in achieving a desired Y. Still, the choice of values of parameters (1) through (5) depends on considerations such as the accuracy and safety requirements for the voltage sensor. Also, in accordance with the lumped admittance model and in order to reduce $Y_{ie}$s, the high admittance material of the isolating-section 2 should be more centrally confined improving isolation of the field in the center from stray field effects.

The proper design procedure involves modeling the voltage sensor column, considering the restrictions provided under various relevant standards (such as those mentioned above), considering the accuracy requirements, and considering the availability of proper materials, their electrical properties, weight, heat generation and dissipation, and cost to provide an economical, accurate (for the intended application), and safe voltage sensor.

EXAMPLES

EFSVT Test Simulations

In the following example, the performance of an EFSVT standoff (particularly the isolating-section 2 of the standoff 21) is described and evaluated by simulation. The EFSVT structure is shown in FIG. 2.

The particular standoff to be analyzed has a height $L_c$=2245 mm and is supported on a grounded stand with height $L_s$=2 m and diameter $d_s$=400 mm. Also, it has a corona ring with inner diameter 539 mm and outer diameter 671 mm at the base of the top electrode. There are 45 rubber sheds; an outer fiberglass tube with inner diameter 300 mm and outer diameter 312 mm; an inner isolating-section 2, a tube with inner diameter $d_i$=198 mm and outer diameter $d_o$=206 mm; and an electrode-to-electrode spacing L=2070 mm. Here, various EFSVT examples are given having different inner tube resistances of infinity, $10^{12}$, $10^9$, $10^8$, $5 \times 10^7$, and $10^6 \Omega$. The relative permittivities of the inner and outer tubes are 5 and the relative permittivity of the surrounding medium is 1 (air). These resistances correspond to conductances of zero, 1 pS, 1 nS, 10 nS, 20 nS, and 1 μS, respectively. In all examples, a single EFS that measures the component $E_x$ of the electric field that is parallel to the axis of the isolating-section at a point in space is assumed to be located halfway between the top and bottom electrodes on the center axis.

For a voltage applied to each EFSVT, the electric field E around the standoff is computed using the finite element method.

Test simulations are set up to measure the performance of the EFSVT designs in different environments. The VT is used to measure the voltage between the top and bottom electrodes with the bottom electrode taken as the reference. The applied voltage is sinusoidal with a frequency of 60 Hertz. The voltage phase is arbitrarily chosen as the reference for the phase information given in these examples (see Tables).

In the first case, a layer of water resting on the sheds and having a uniform thickness of 0.25 mm is simulated for each EFSVT with varying degrees of water contamination represented by resistivities of $10^8$ Ω-cm, $10^5$ Ω-cm, and 100 Ω-cm. This case is simulated for isolating-section resistances of ∞, $10^{12}$, $10^9$, $10^8$, $5 \times 10^7$, and $10^6 \Omega$.

In the second case, by removing the portion of the water layer in Case 1 covering the top five sheds (Shed #41 through Shed #45 counting from the bottom), dryband conditions near the top of the standoff are simulated for each EFSVT with varying levels of water contamination represented by resistivities of $10^8$ Ω-cm, $10^5$ Ω-cm, and 100 Ω-cm. In the third case, by removing the portion of the water layer in Case 1 covering Shed #12 through Shed #16, dryband conditions near the lower end of the standoff are simulated for each EFSVT with varying degrees of water contamination represented by resistivities of $10^8$ Ω-cm, $10^5$ Ω-cm, and 100 Ω-cm. These two cases are simulated for isolating-section resistances of infinite resistance, 100 MΩ, and 50 MΩ.

Since the frequency is fixed at a single frequency of 60 Hertz for all of these cases, the measured or determined voltage $V_d$ can be represented by an amplitude and a phase. Though in general the output of the VT gives an instantaneous reading of voltage continuously in time.

Generally speaking, for a linear medium, where the electrical properties of the medium are not functions of electric field E, if the voltage sources influencing the medium are temporally sinusoidal with one frequency, each component of E is temporally sinusoidal with the same frequency. So, $E_x$ is sinusoidal with a frequency of 60 Hz and can also be represented by a magnitude and phase.

Generally, the voltage measured $V_d$ can be determined from the EFS outputs with $$V_d = \sum_{i=1}^{n} C_i E_{x,i},$$

where $E_{x,i}$ is the output of the ith EFS, $C_i$ is the calibration constant and/or gain factor of the ith EFS, and n is the total number of EFSs, as is described in the above referred to Jaeger et al. application incorporated herein by reference. For the examples, this expression simplifies to $$V_d = CE_x,$$

where C is a calibration constant having a magnitude component and a phase component. Also, the error between the actual voltage V applied and the voltage measured $V_d$ will be expressed in terms of an amplitude error and a phase error.

It should be noted that the magnitude of C is a constant of proportionality and is determined based on the applied voltage that is to be measured; in the case examples, we are looking for normalized or percentage errors and we are not concerned with the actual voltage class. Also, the percentage errors given are relative to (percentage of) the amplitude of the applied voltage signal.

Table 1 shows results for the Case 1 simulations. It can be observed from these results that generally as the isolating-section resistance decreases, the amplitude error incurred by the presence of the uniform layer of water resting on the sheds decreases significantly. The phase error also decreases as the isolating-section resistance decreases for isolating-section resistances below 1 GΩ i.e. for isolating-section conductances greater than 1 nS.

Table 2 and Table 3 show results for Case 2 and Case 3, respectively. Also, test simulations here focus on inner tube resistances of 50 MΩ and 100 MΩ since they are in the range of the lowest allowable resistance values for practical high-voltage applications for 230 kV class voltage transducers. The effect of dryband conditions are studied here since these are expected to be practically some of the worst-case scenarios in terms of the effects of external causes that disturb the electric field inside the isolating-section. Again, greatly reduced errors in phase and amplitude due to a decreased isolating-section resistance is evident in the tables.

For all of the above cases, it should be noted that having a uniform layer of contaminated water with a thickness of 0.25 mm and a resistance of 100 Ω-cm is a very extreme case intended to simulate a scenario that is significantly worse than most real scenarios.

TABLE 1

EFSVT Simulation Results for Total Uniform Water Deposit.

| Inner tube resistance (MΩ) | Water resistivity (MΩ-cm) | Amplitude error in % | Phase error in minutes |
|---|---|---|---|
| ∞ | 100 | −0.65 | 0.99 |
| 1000000 | 100 | −0.60 | 0.85 |
| 1000 | 100 | 1.30 | −4.62 |
| 100 | 100 | 0.04 | 6.85 |
| 50 | 100 | 0.01 | 3.50 |
| 1 | 100 | 0.00 | 0.07 |
| ∞ | 0.1 | −11.51 | 677.91 |
| 1000000 | 0.1 | −11.17 | 664.51 |
| 1000 | 0.1 | −7.99 | −45.09 |
| 100 | 0.1 | −0.55 | 9.57 |
| 50 | 0.1 | −0.30 | 5.70 |
| 1 | 0.1 | −0.01 | 0.13 |
| ∞ | 0.0001 | −82.10 | 4.57 |
| 1000000 | 0.0001 | −80.64 | 2.69 |
| 1000 | 0.0001 | −31.06 | −1057.18 |
| 100 | 0.0001 | −0.62 | −190.01 |
| 50 | 0.0001 | −0.17 | −96.19 |
| 1 | 0.0001 | 0.00 | −1.93 |

TABLE 2

EFSVT Simulation Results for Uniform Water Deposit and Upper Dryband.

| Inner tube resistance (MΩ) | Water resistivity (MΩ-cm) | Amplitude error in % | Phase error in minutes |
|---|---|---|---|
| ∞ | 100 | 0.07 | 0.14 |
| 100 | 100 | 0.04 | 8.02 |
| 50 | 100 | 0.01 | 4.06 |
| ∞ | 0.1 | −6.10 | 113.34 |
| 100 | 0.1 | 0.53 | 14.61 |
| 50 | 0.1 | 0.23 | 7.80 |
| ∞ | 0.0001 | 97.58 | −5320.43 |
| 100 | 0.0001 | 5.95 | 1282.49 |
| 50 | 0.0001 | 2.23 | 649.49 |

TABLE 3

EFSVT Simulation Results for Uniform Water Deposit and Lower Dryband.

| Inner tube resistance (MΩ) | Water resistivity (MΩ-cm) | Amplitude error in % | Phase error in minutes |
|---|---|---|---|
| ∞ | 100 | −0.23 | 0.53 |
| 100 | 100 | 0.06 | 8.95 |
| 50 | 100 | 0.02 | 4.62 |
| ∞ | 0.1 | −9.18 | 383.81 |
| 100 | 0.1 | −0.21 | 18.74 |
| 50 | 0.1 | −0.14 | 10.59 |
| ∞ | 0.0001 | 86.08 | −557.53 |
| 100 | 0.0001 | −7.73 | −395.75 |
| 50 | 0.0001 | −2.80 | −251.99 |

The above cases and Tables are showing a situation where one EFS sensor is used together with RS for measuring voltage. It is evident from the description given in this application that when using multiple EFSs, e.g., as described in the Jaeger et al. application, for determining said voltage difference, resistive shielding can further improve accuracy by its electric field distribution smoothing effect, see FIG. 4 for example, so that when methods such as those described in the Jaeger et al application are used, the effect of external influences on the voltage differences determined is further reduced. For example, the simplified model given in FIG. 3 can be used to show that when $Y_i$ is relatively large, e.g., when significant resistive shielding is present, the effect of external influences on the electric field distribution inside the resistive shield, i.e., column center, is smaller as compared to when $Y_i$ is relatively small.

Having described the invention modifications will be evident to those skilled in the art without departing from the spirit of the invention as defined in the appended claims.

We claim:

1. An apparatus for measuring voltage comprising:

an electrically isolating-section;

a pair of spaced conductors between which voltage difference V is to be determined, one of said conductors being at one end of said isolating-section and another at an end of said isolating-section remote from said one end;

at least one electric field sensor which senses electric field at at least one location within said isolating-section;

a detector for determining a value $V_d$ for said voltage difference V based on said electric field(s) sensed by said at least one electric field sensor; and wherein said isolating-section is formed of a primarily resistive material having a resistance in the range of 50 kΩ to 25 GΩ so as to provide sufficient shielding of said at least one location from sources of electric field interference of practical strength external to said apparatus so that said sources of practical strength do not change said sensed electric field sensed at said at least one location to generate a significant error in said value $V_d$ for said voltage difference V.

2. An apparatus for measuring voltage as defined in claim 1 wherein said isolating-section is made from polyethylene doped with carbon black.

3. An apparatus for measuring voltage as defined in claim 1, wherein said isolating-section is hollow.

4. An apparatus for measuring voltage as defined in claim 1, further comprising a protective sleeve protecting said isolating-section from the environment.

5. An apparatus for measuring voltage as defined in claim 1, wherein said electric field sensor is an optical electric field sensor.

6. An apparatus for measuring voltage comprising:
an electrically isolating-section;
a pair of spaced conductors between which voltage difference V is to be determined, one of said conductors being at one end of said isolating-section and another at an end of said isolating-section remote from said one end;
at least one electric field sensor which senses electric field at at least one location within said isolating-section;
a detector for determining a value $V_d$ for said voltage difference V based on said electric field(s) sensed by said at least one electric field sensor; and
wherein said isolating-section is formed of a primarily resistive material having a conductance per unit of length in the range of 50 kΩ/m to 25 Ω/m so as to provide sufficient shielding of said at least one location from sources of electric field interference of practical strength external to said apparatus so that said sources of practical strength do not change said sensed electric field sensed at said at least one location to generate a significant error in said value $V_d$ for said voltage difference V.

7. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:
at least one electric field sensor between said first and second terminals for providing an electric field output signal indicative of the electric field, thereat;
detector means for determining an electric potential value, $V_d$, representative of said electric potential V between said first and second spaced apart conductors as a function of said electric field output signal; and
an electric field isolating section in proximity to said electric field sensor having first and second terminating ends adapted to be electrically connected to said first and second terminals, wherein said electric field isolating section has a selected electrical resistive characteristic so as to reduce any error in $V_d$ due to any external electric field disturbances.

8. The apparatus of claim 7 further wherein said resistive characteristic is in the order of 25 GΩ/meter to 50 kΩ/meter along said isolating section between said first and second terminals.

9. The apparatus of claim 7 wherein:
said isolating section is a hollow tubular resistor, and said at least one electric field sensor is within said hollow tubular resistor.

10. The apparatus of claim 7 wherein said at least one electric field sensor is an optical electric field sensor.

11. The apparatus of claim 7 further comprising:
a hollow insulator column for supporting said first and second terminals, and
said isolating section and said at least one electric field sensor are within said hollow insulator column.

12. The apparatus of claim 11 wherein said isolating section is constructed by way of a resistive coating on a surface of said hollow insulator.

13. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:
at least one electric field sensor between said first and second terminals for providing an electric field output signal indicative of the electric field, thereat;
detector means for determining an electric potential value, $V_d$, representative of said electric potential V between said first and second spaced apart conductors as a function of said electric field output signal;
a generally tubular resistor structure having first and second terminating ends adapted to be electrically connected to said first and second conductors; and
wherein,
said at least one electric field sensor is positioned within an interior portion of said tubular resistor, and,
said generally tubular resistor structure has a selected electrical resistive characteristic so as to reduce any error in $V_d$ due to any external electric field disturbances.

14. The apparatus of claim 13 wherein said resistive characteristic is in the order of 25 GΩ/meter to 50 kΩ/meter along said tubular resistor structure between said first and second terminals.

15. The apparatus of claim 13 further comprising:
a hollow insulator column for supporting said first and second terminals, and
said tubular resistor and said at least one electric field sensor are within said hollow insulator column.

16. The apparatus of claim 13 wherein said at least one electric field sensor is an optical electric field sensor.

17. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:
a plurality of electric field sensors spatially positioned at mutually exclusive positions between said first and second terminals, where each of said plurality of sensors provides an electric field output signal indicative of the sensed electric field thereat;
detector means for determining an electric potential value, $V_d$, representative of said electric potential V between said first and second spaced apart conductors as a function of said electric field output signal associated with each of said plurality of electric field sensors; and
an electric field isolating section, in proximity to said plurality of electric field sensors, having first and second terminating ends adapted to be electrically connected to said first and second terminals, wherein said electric field isolating section has a selected electrical resistive characteristic so as to reduce any error in $V_d$ due to any external electric field disturbances.

18. The apparatus of claim 17 further wherein said resistive characteristic is in the order of 25 GΩ/meter to 50 kΩ/meter along said isolating section between said first and second terminals.

19. The apparatus of claim 17 wherein:
said isolating section is a hollow tubular resistor, and
said plurality of electric field sensors is within said hollow tubular resistor.

20. The apparatus of claim 17 wherein said plurality of electric field sensors are optical electric field sensors.

21. The apparatus of claim 17 further comprising:
a hollow insulator column for supporting said first and second terminals, and
said isolating section and said plurality of electric field sensors are within said hollow insulator column.

22. The apparatus of claim 21 wherein said isolating section is constructed by way of a resistive coating on a surface of said hollow insulator.

23. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:
a plurality of electric field sensors spatially positioned at mutually exclusive positions between said first and second terminals, where each of said plurality of sensors provides an electric field output signal indicative of the sensed electric field thereat;
detector means for determining an electric potential value, $V_d$, representative of said electric potential V between said first and second spaced apart conductors as a function of said electric field output signal associated with each of said plurality of electric field sensors; and
a generally tubular resistor structure having first and second terminating ends adapted to be electrically connected to said first and second conductors; and
wherein,
said plurality of electric field sensors are spatially positioned within an interior portion of said tubular resistor, and,
said generally tubular resistor structure has a selected electrical resistive characteristic so as to reduce any error in $V_d$ due to any external electric field disturbances.

24. The apparatus of claim 23 wherein said resistive characteristic is in the order of 25 GΩ/meter to 50 kΩ/meter along said tubular resistor structure between said first and second terminals.

25. The apparatus of claim 23 further comprising:
a hollow insulator column for supporting said first and second terminals, and
said tubular resistor and said at least one electric field sensor are within said hollow insulator column.

26. The apparatus of claim 23 wherein said at least one electric field sensor is an optical electric field sensor.

27. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:
a plurality of optical electric field sensors wherein,
each of said optical electric field sensors are spatially positioned at mutually exclusive positions between said first and second terminals, and
each of said sensors includes an optical input port for receiving an input light wave, and an optical output port for passing an output optical wave having passed therethrough, at least in part,
detector means for determining an electric potential value, $V_d$, representative of said electric potential V between said first and second spaced apart conductors as a function of said output optical wave of each of said plurality of optical electric field sensors; and
an electric field isolating section, in proximity to said plurality of electric field sensors, having first and second terminating ends adapted to be electrically connected to said first and second terminals, wherein said electric field isolating section has a selected electrical resistive characteristic so as to reduce any error in $V_d$ due to any external electric field disturbances.

28. The apparatus of claim 27 further comprising:
a hollow insulator column for supporting said first and second terminals, and
said electric field isolating section and said plurality of optical electric field sensors are within said hollow insulator column.

29. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:
a plurality of optical electric field sensors wherein,
each of said optical electric field sensors are spatially positioned at mutually exclusive positions between said first and second terminals, and
each of said sensors includes an optical input port for receiving an input light wave, and an optical output port for passing an output optical wave having passed therethrough, at least in part,
detector means for determining an electric potential value, $V_d$, representative of said electric potential V between said first and second spaced apart conductors as a function of said output optical wave of each of said plurality of optical electric field sensors; and
a generally tubular resistor structure having first and second terminating ends adapted to be electrically connected to said first and second conductors; and
wherein,
said plurality of optical electric field sensors are spatially positioned within an interior portion of said tubular resistor, and,
said generally tubular resistor structure has a selected electrical resistive characteristic so as to reduce any error in $V_d$ due to any external electric field disturbances.

30. The apparatus of claim 29 further comprising:
a hollow insulator column for supporting said first and second terminals, and
said tubular resistor and said plurality of optical electric field sensors are within said hollow insulator column.

31. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:
a plurality of optical electric field sensors spatially positioned at mutually exclusive positions between said first and second terminals, where each of said plurality optical electric field sensors is responsive to electric field at its corresponding position thereat, wherein said optical electric field sensors are connected in series such that an input light wave, first enters an input port of a first one of said plurality of optical sensors, passes therethrough, at least in part, and exits an output thereof, successively passes into, through, an out of, at least in part, each remaining one of said plurality of optical sensors, thereby providing an output light wave exiting an output port of a last one of said plurality of optical sensors, such that said output light wave varies in relation to the sum of sensed electric field by each of said plurality of optical electric field sensors;

detector means for determining an electric potential value, $V_d$, representative of said electric potential V between said first and second spaced apart conductors as a function of said output light wave; and an electric field isolating section, in proximity to said plurality of electric field sensors, having first and second terminating ends adapted to be electrically connected to said first and second terminals, wherein said electric field isolating section has a selected electrical resistive characteristic so as to reduce any error in $V_d$ due to any external electric field disturbances.

32. The apparatus of claim 31 further comprising:

a hollow insulator column for supporting said first and second terminals, and said electric field isolating section and said plurality of optical electric field sensors are within said hollow insulator column.

33. An apparatus for measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors comprising:

a plurality of optical electric field sensors spatially positioned at mutually exclusive positions between said first and second terminals, where each of said plurality optical electric field sensors is responsive to electric field at its corresponding position thereat, wherein said optical electric field sensors are connected in series such that an input light wave, first enters an input port of a first one of said plurality of optical sensors, passes therethrough, at least in part, and exits an output thereof, successively passes into, through, an out of, at least in part, each remaining one of said plurality of optical sensors, thereby providing an output light wave exiting an output port of a last one of said plurality of optical sensors, such that said output light wave varies in relation to the sum of sensed electric field by each of said plurality of optical electric field sensors;

detector means for determining an electric potential value, $V_d$, representative of said electric potential V between said first and second spaced apart conductors as a function of said output light wave; and a generally tubular resistor structure having first and second terminating ends adapted to be electrically connected to said first and second conductors; and wherein, said plurality of optical electric field sensors are spatially positioned within an interior portion of said tubular resistor, and, said generally tubular resistor structure has a selected electrical resistive characteristic so as to reduce any error in $V_d$ due to any external electric field disturbances.

34. The apparatus of claim 33 further comprising:

a hollow insulator column for supporting said first and second terminals, and said tubular resistor and said plurality of optical electric field sensors are within said hollow insulator column.

35. A method of measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors, the method comprising the steps of:

spatially positioning electric field sensors at one or more mutually exclusive positions between said first and second terminals;

isolating said electric field sensors by way of an electric field isolating section spatially positioned in proximity to said electric field sensor and having first and second terminating ends adapted to be electrically connected to said first and second terminals, wherein said electric field isolating section has a selected electrical resistive characteristic so as to reduce any error in sensed electric field by said electric field sensors due to any external electric field disturbances; and detecting electric field sensed by said one or more electric field sensors for determining an electric potential value, $V_d$, representative of said electric potential V between said first and second spaced apart conductors as a function of said electric field output signal.

36. A method of measuring electric potential, V, between first and second spaced apart conductors coupled to first and second terminals, respectively, separated by a distance L, wherein any electric potential between said first and second terminals, establishes an electric field distribution therebetween in relation to any electric potential between said spaced apart conductors, the method comprising the steps of:

spatially positioning electric field sensors at one or more mutually exclusive positions between said first and second terminals;

isolating said electric field sensors within a tubular resistor having first and second terminating ends adapted to be electrically connected to said first and second terminals, wherein said electric field isolating section has a selected electrical resistive characteristic so as to reduce any error in sensed electric field by said electric field sensors due to any external electric field disturbances; and detecting electric field sensed by said one or more electric field sensors for determining an electric potential value, $V_d$, representative of said electric potential V between said first and second spaced apart conductors as a function of said electric field output signal.

37. The method of claim 36 wherein electric field sensor is an optical electric field sensor.

* * * * *